United States Patent
Hung et al.

(10) Patent No.: US 8,835,935 B2
(45) Date of Patent: Sep. 16, 2014

(54) TRENCH MOS TRANSISTOR HAVING A TRENCH DOPED REGION FORMED DEEPER THAN THE TRENCH GATE

(75) Inventors: Chien-Chung Hung, Hsinchu County (TW); Young-Shying Chen, Hsinchu (TW); Cheng-Tyng Yen, Kaohsiung (KR); Chwan-Ying Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 116 days.

(21) Appl. No.: 13/433,272

(22) Filed: Mar. 28, 2012

(65) Prior Publication Data

US 2013/0161736 A1  Jun. 27, 2013

(30) Foreign Application Priority Data

Dec. 21, 2011  (TW) .............................. 100147745 A

(51) Int. Cl.
   *H01L 29/24* (2006.01)
(52) U.S. Cl.
   USPC ............................................ 257/77; 257/341
(58) Field of Classification Search
   CPC ..................... H01L 29/0623; H01L 29/0634
   USPC .................................................. 257/77, 341
   See application file for complete search history.

(56) References Cited

U.S. PATENT DOCUMENTS

| 5,719,409 | A | 2/1998 | Singh et al. |
| 7,825,449 | B2 | 11/2010 | Suzuki et al. |
| 7,968,940 | B2 | 6/2011 | Udrea |
| 7,994,513 | B2 | 8/2011 | Yamamoto et al. |
| 2005/0167695 | A1* | 8/2005 | Yilmaz ......................... 257/134 |
| 2007/0194375 | A1* | 8/2007 | Kawaguchi et al. .......... 257/330 |
| 2008/0099837 | A1* | 5/2008 | Akiyama et al. .............. 257/341 |
| 2009/0261350 | A1* | 10/2009 | Yamamoto et al. ............. 257/77 |

FOREIGN PATENT DOCUMENTS

| TW | I338368 | 3/2011 |
| TW | I345311 | 7/2011 |

OTHER PUBLICATIONS

Anant K. Agarwal, et al., "Temperature Dependence of Fowler-Nordheim Current in 6H- and 4H-SiC MOS Capacitors", IEEE Electron device lett., vol. 18, No. 12, Dec. 1997, p. 592-594.
Srikant Sridevan, et al., "Analysis of Gate Dielectrics for Sic Power UMOSFETs", IEEE, 1997, p. 153-156.
A. K. Agarwal, et al., "1.1 kV 4H-SiC Power UMOSFET's", IEEE Electron device lett., vol. 18, No. 12, Dec. 1997,p. 586-588.
J. Tan, et al., "High-Voltage Accumulation-Layer UMOSFET's in 4H-SiC", IEEE Electron device lett., vol. 19, No. 12, Dec. 1998, p. 487-489.
Dethard Peters, et al., "An 1800 V Triple Implanted Vertical 6H-SiC MOSFET", IEEE Trans. on Electron Devices, vol. 46, No. 3, Mar. 1999, p. 542-545.

* cited by examiner

*Primary Examiner* — Fernando L Toledo
*Assistant Examiner* — Peter Bradford
(74) *Attorney, Agent, or Firm* — Jianq Chyun IP Office

(57) ABSTRACT

A trench metal oxide semiconductor transistor device and a manufacturing method thereof are described. The trench metal oxide semiconductor transistor device includes a substrate of a first conductivity type, a drift region of the first conductivity type, a deep trench doped region of a second conductivity type, an epitaxial region of the second conductivity type, a trench gate, a gate insulating layer, a source region, a drain electrode and a source electrode. The drift region has at least one deep trench therein, and the deep trench doped region is disposed in the deep trench. The trench gate passes through the epitaxial region, and a distance between a bottom of the trench gate and a bottom of the deep trench doped region is 0.5~3 μm.

17 Claims, 9 Drawing Sheets

TRENCH MOS TRANSISTOR HAVING A TRENCH DOPED REGION FORMED DEEPER THAN THE TRENCH GATE

CROSS-REFERENCE TO RELATED APPLICATION

This application claims the priority benefit of Taiwan application serial no. 100147745, filed on Dec. 21, 2011. The entirety of the above-mentioned patent application is hereby incorporated by reference herein and made a part of this specification.

TECHNICAL FIELD

The disclosure relates to a trench metal oxide semiconductor (MOS) transistor device and a manufacturing method thereof.

BACKGROUND

In order to achieve standards of low carbon emission and high energy efficiency, power devices are important in electronic devices and power supply systems. In the green energy industries, such as electric vehicle (EV)/hybrid electric vehicle (HEV) industries, distributed power and smart grid industries, and wind power and photo voltaic system industries, power consuming and energy conversion efficiency of devices are critical in power saving Since wide band gap materials, such as silicon carbide (SiC) have high thermal conductivity which is three times the thermal conductivity of silicon, the wide band gap materials can be used or operated in a higher temperature condition and are beneficial to applied to small heat sink module systematization. In addition, SiC has a high withstand voltage and a high critical breakdown electric field characteristic, and a withstand layer can have a higher concentration and a thinner thickness in the devices, such that the devices using SiC have a lower resistance and the turn-on power consuming is reduced. Moreover, because the carrier concentration of SiC is lower than that of Si, SiC has a lower current leakage characteristic and a short response time almost near zero, so that the turn-off power consuming of the devices is lower.

However, the transistor device using SiC still has many problems needed to be overcome, such as insufficient turn-on current of the transistor device, decreasing electric field strength at the gate oxide layer of the power transistor device when a breakdown of the transistor device occurs.

SUMMARY

A trench metal oxide semiconductor transistor device includes a substrate of a first conductivity type, a drift region of the first conductivity type, a deep trench doped region of a second conductivity type, an epitaxial region of the second conductivity type, a trench gate, a gate insulating layer, a source region, a drain electrode, and a source electrode. The substrate has a first surface and a second surface. The drift region is disposed on the first surface of the substrate and having at least one deep trench therein. The deep trench doped region is disposed in the deep trench. The epitaxial region is disposed on the drift region. The trench gate passes through the epitaxial region, and a distance between a bottom of the trench gate and a bottom of the deep trench doped region is 0.5~3 µm. The gate insulating layer is disposed on a surface of the trench gate. The source region is disposed in the epitaxial region and disposed beside two sides of the trench gate. The drain electrode is disposed on the second surface of the substrate. The source electrode is disposed on the source region.

A method of manufacturing a trench metal oxide semiconductor transistor device is provided. A substrate of a first conductivity type is provided, the substrate has a first surface and a second surface, and a drift region of the first conductivity type is formed on the first surface of the substrate. At least one deep trench is formed in the drift region. A doped material of a second conductivity type is formed in the deep trench to form a deep trench doped region of the second conductivity type. An epitaxial region of the second conductivity type is formed on the drift region. A source region is formed in the epitaxial region. A trench gate is formed in the epitaxial region and a gate insulating layer is formed on a surface of the trench gate. A source electrode is formed on the source region and a drain electrode is formed on the second surface of the substrate.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

In the following exemplary embodiments of the disclosure, the first conductivity type and the second conductivity type are respectively N type and P type for illustration, which should not be construed as a limitation to the disclosure. According to another embodiment, the first conductivity type and the second conductivity type may also be P type and N type respectively.

First Exemplary Embodiment

Figure 1A:
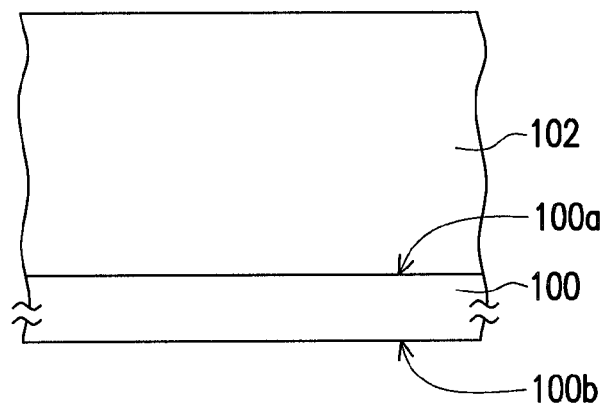
FIG. 1A to FIG. 1G are schematic cross-sectional views showing a method of manufacturing a trench metal oxide semiconductor transistor device according to an exemplary embodiment.

FIG. 1A to FIG. 1G are schematic cross-sectional views showing a method of manufacturing a trench metal oxide semiconductor transistor device according to an exemplary embodiment. Referring to FIG. 1A, a substrate 100 of a first conductivity type is provided, and the substrate 100 has a first surface 100a and a second surface 100b. In the exemplary embodiment, the substrate 100 is an N+ substrate and has a thickness about 350 µm. The substrate 100 is a semiconductor substrate doped with a first conductivity type dopant. The semiconductor substrate includes silicon carbide, silicon or any other appropriate semiconductor material, preferably the semiconductor substrate includes silicon carbide. The first conductivity type dopant doped in the semiconductor substrate is an N type dopant, such as nitrogen or phosphorus, and the dopant concentration is 1E18~1E20 atoms/cm$^3$.

In addition, a drift region 102 of the first conductivity type is formed on the first surface 100a of the substrate 100. In the exemplary embodiment, the drift region 102 is an N− drift region and has a thickness ranged from 5 μm to 30 μm. The drift region 102 is a semiconductor material doped with a first conductivity type dopant. The semiconductor material includes silicon carbide, silicon or any other appropriate semiconductor material, preferably the semiconductor material includes silicon carbide. The first conductivity type dopant doped in the semiconductor material is an N type dopant, such as nitrogen or phosphorus, and the dopant concentration is 1E14~5E16 atoms/cm$^3$.

According to another embodiment, a buffer region (not shown) may also be further formed between the substrate 100 and the drift region 102, and the buffer region has a thickness about 0.5 μm. The buffer region is a semiconductor region doped with a first conductivity type dopant. The first conductivity type dopant is an N type dopant, such as nitrogen or phosphorus, and the dopant concentration is about 1E18 atoms/cm$^3$.

Figure 1B:
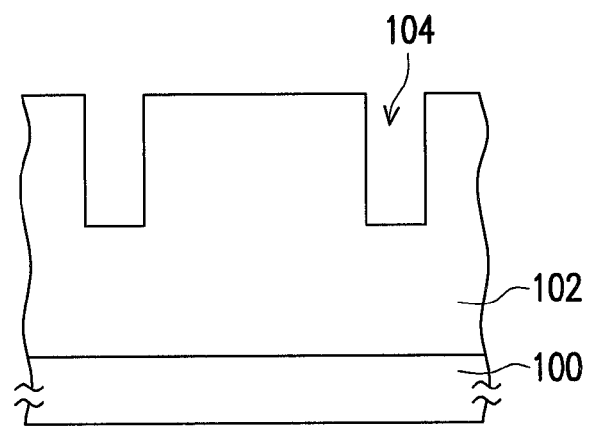

Referring to FIG. 1B, at least one deep trench 104 is formed in the drift region 102. The deep trench 104 is formed with a photolithographic and etching process, for example, and the deep trench 104 has a depth ranged from 0.5 μm to 4 μm.

Figure 1C:
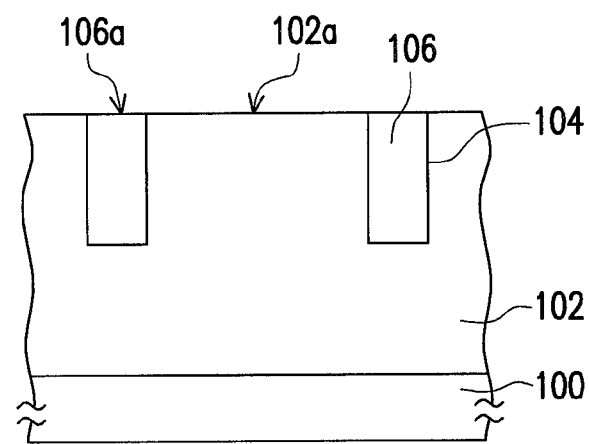

Referring to FIG. 1C, a doped material of a second conductivity type is formed in the deep trench 104 to form a deep trench doped region 106 of the second conductivity type. In the exemplary embodiment, the deep trench doped region 106 is a P type deep trench doped region 106. The deep trench doped region 106 is a semiconductor epitaxial material doped with a P type dopant. The semiconductor epitaxial material includes silicon carbide, silicon or any other appropriate semiconductor material, preferably the semiconductor epitaxial material includes silicon carbide. The P type dopant doped in the semiconductor epitaxial material includes aluminium (Al) or boron (B), and the concentration of the P type dopant is 1E17~1E20 atoms/cm$^3$. According to an exemplary embodiment, the method of forming the doped material in the deep trench 104 to form the deep trench doped region 106 comprises performing a selective epitaxial growth process to form the doped material in the deep trench 104. According to another exemplary embodiment, the method of forming the doped material in the deep trench 104 to form the deep trench doped region 106 includes performing an epitaxial growth process to form the doped material and then performing a planarization process to remove a portion of the doped material until a surface 102a of the drift region 102 is exposed such that the deep trench doped region 106 is formed. The planarization process is, for instance, a chemical mechanical polishing process. Herein, after performing the selective epitaxial growth process or performing the epitaxial growth process and the planarization process, a top surface 106a of the deep trench doped region 106 and the surface 102a of the drift region 102 are co-planar.

Figure 1D:
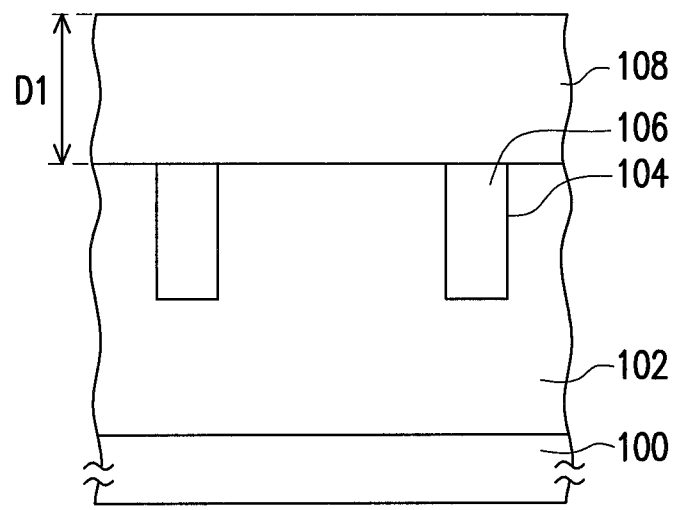

As shown in FIG. 1D, an epitaxial region 108 of the second conductivity type is formed on the drift region 102 and the deep trench doped region 106. In the exemplary embodiment, the epitaxial region 108 is a P type epitaxial region. The epitaxial region 108 is formed by performing an epitaxial growth process and the formed epitaxial region 108 has a thickness ranged from 1 μm to 4 μm. Namely, a distance D1 between an upper surface of the epitaxial region 108 and the surface 102a of the drift region 102 ranges from 1 μm to 4 μm. In addition, the epitaxial region 108 is a semiconductor epitaxial material doped with a second conductivity type (P type) dopant. The semiconductor epitaxial material includes silicon carbide, silicon or any other appropriate semiconductor material, preferably the semiconductor epitaxial material includes silicon carbide. The P type dopant doped in the semiconductor epitaxial material includes aluminium (Al) or boron (B), and the concentration of the P type dopant is 1E16~5E18 atoms/cm$^3$.

Figure 1E:
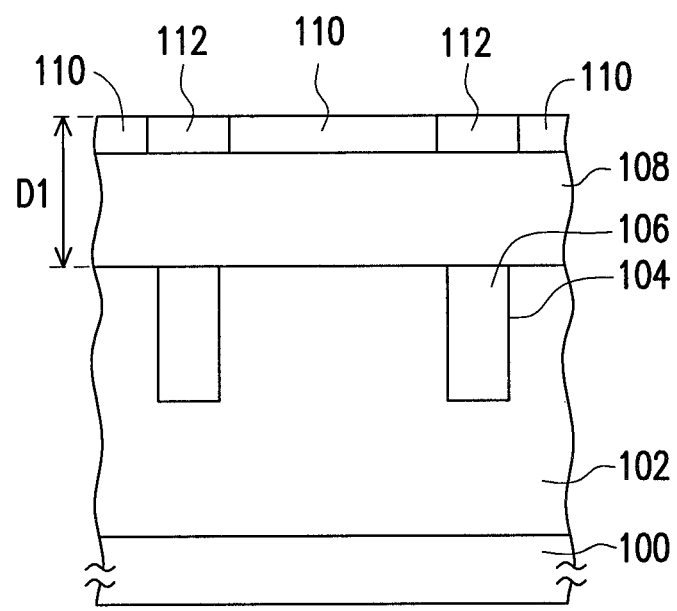

Referring to FIG. 1E, a source region is formed in the epitaxial region 108. According to the exemplary embodiment, the source region comprises a source region of the first conductivity type (N+ source region) 110 and a source region of the second conductivity type (P+ source region) 112. The source regions 110, 112 are formed by ion implantation processes. The dopant in the source region (N+ source region) 110 includes nitrogen (N) or phosphorus (P), a dopant concentration of the source region 110 is about 1E19~1E21 atoms/cm$^3$, and a depth of the source region 110 is about 0.5 μm. The dopant in the source region (P+ source region) 112 includes aluminium (Al) or boron (B), a dopant concentration of the source region 112 is about 1E19~1E20 atoms/cm$^3$, and a depth of the source region 112 is about 0.5 μm.

Figure 1F:
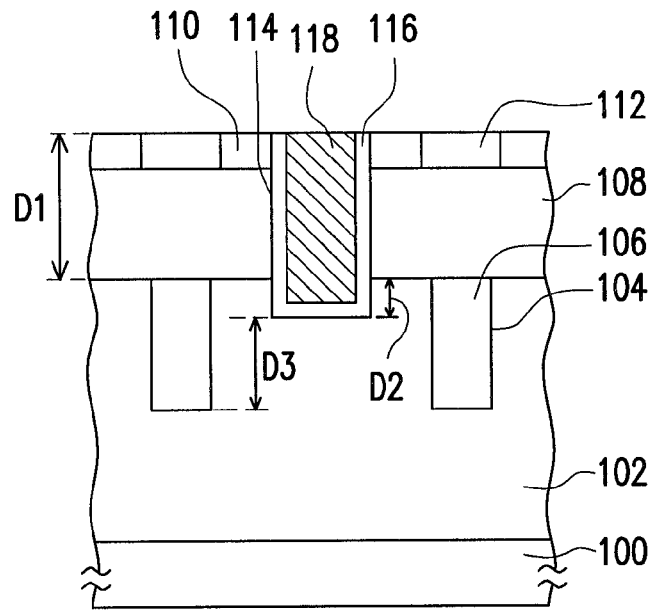

Referring to FIG. 1F, a trench gate 118 is formed in the epitaxial region 108 and a gate insulating layer 116 is formed on a surface of the trench gate 118. The trench gate 118 and the gate insulating layer 116 are formed, for example, by forming a trench 114 having a depth about 1 μm~5 μm in the epitaxial region 108. A distance D3 between a bottom of the trench 114 and the bottom the deep trench doped region 106 ranges from 0.5 μm to 3 μm. In the exemplary embodiment, the trench gate 114 passes through the epitaxial region 108 and extends to the drift region 102. Namely, a distance D2 between the bottom of the trench 114 and the surface 102a of the drift region 102 is about 0~1 μm. Thereafter, the gate insulating layer 116 is formed on the surface of the trench 114. The gate insulating layer 116 comprises silicon oxide, silicon nitride, silicon oxynitrogen or any other appropriate insulating material having high dielectric constant, and the gate insulating layer 116 has a thickness about 500~1000 angstroms. A conductive material (such as poly-silicon) is formed in the trench 114, and then an etching back process or a planarization process is performed, so as to form the trench gate 118.

It is noted that, since the distance D3 between the bottom of the trench 114 and the bottom the deep trench doped region 106 ranges from 0.5 μm to 3 μm, a distance between the bottom of the trench gate 118 and the bottom the deep trench doped region 106 is also about 0.5 μm~3 μm.

Figure 1G:
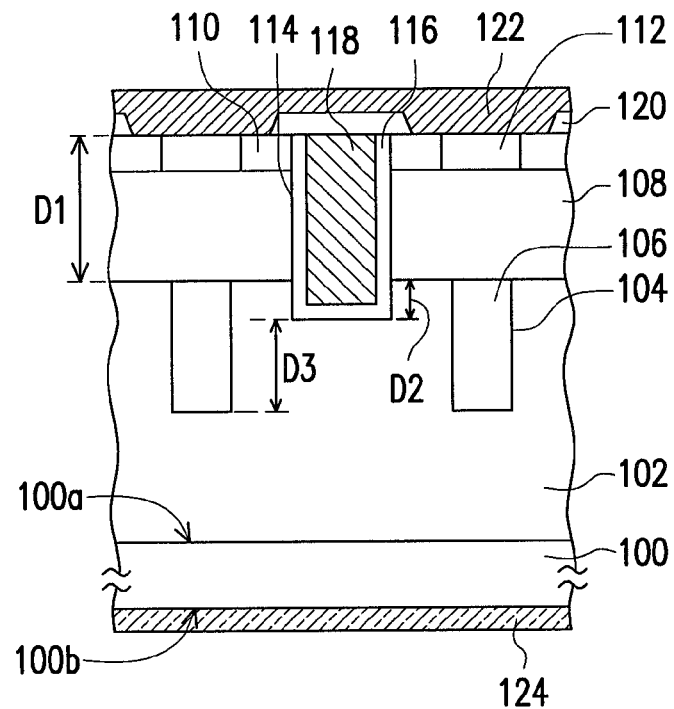

Referring to FIG. 1G, a source electrode 122 is formed on the source regions 110, 112 and a drain electrode 124 is formed on the second surface 100b of the substrate 100. In the exemplary embodiment, the source electrode 122 and the drain electrode 124 is comprised of an ohmic contact layer and a metal layer, the ohmic contact layer comprises nickel (Ni), titanium (Ti) or any other appropriate ohmic contact material, and the metal layer comprises aluminium (Al), cupper (Cu), gold (Au), or any other appropriate metallic material. Moreover, a dielectric layer 120 is further formed between the source electrode 112 and the source regions 110, 112, so as to electrically isolate the source electrode 122 and the trench gate 118.

The trench metal oxide semiconductor transistor device formed by the method of FIG. 1A to FIG. 1G is as shown in FIG. 1G, which comprises a substrate 100 of a first conductivity type, a drift region 102 of the first conductivity type, a deep trench doped region 106 of a second conductivity type, an epitaxial region 108 of the second conductivity type, a trench gate 118, a gate insulating layer 116, source regions 110, 112, a drain electrode 124, and a source electrode 122. The substrate 100 has a first surface 100a and a second surface 100b. The drift region 102 is disposed on the first surface 100a of the substrate 100 and has at least one deep trench 104 therein. The deep trench doped region 106 is disposed in the deep trench 104. The epitaxial region 108 is disposed on the drift region 102. The trench gate 118 passes through the epitaxial region 108, and a distance between a bottom of the trench gate 118 and a bottom of the deep trench doped region 106 is 0.5~3 μm. The gate insulating layer 116 is disposed on a surface of the trench gate 118. The source regions 110, 112 are disposed in the epitaxial region 108 and disposed beside two sides of the trench gate 118. The drain electrode 124 is disposed on the second surface 100b of the substrate 100. The source electrode 122 is disposed on the source region 110, 112.

In the exemplary embodiment, the distance between the bottom of the trench gate 118 and the bottom of the deep trench doped region 106 is 0.5~3 μm. When the transistor device is operated with a reversed withstand voltage, a breakdown of the transistor device is likely to occur at the bottom of the deep trench doped region 106. Since the distance between the bottom of the trench gate 118 and the bottom of the deep trench doped region is large enough, the electric field distribution can be dispersed effectively, such that the electric field at the bottom and the corner of the gate 118 is reduced and the device reliability can be improved.

Second Exemplary Embodiment

Figure 2:
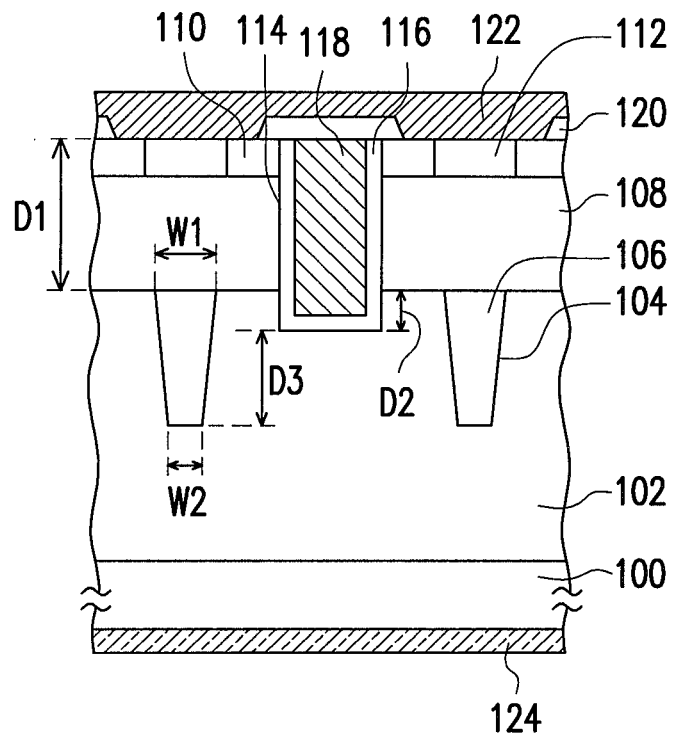
FIG. 2 is a schematic cross-sectional view showing a trench metal oxide semiconductor transistor device according to an exemplary embodiment.

FIG. 2 is a schematic cross-sectional view showing a trench metal oxide semiconductor transistor device according to an exemplary embodiment. Referring to FIG. 2, the trench metal oxide semiconductor transistor device of the exemplary embodiment is similar to the trench metal oxide semiconductor transistor device of FIG. 1F, so that the same devices are denoted by the same symbols, and descriptions thereof are not repeated. In the exemplary embodiment, the deep trench doped region 106 has a top width w1 and a bottom width w2, and the top width w1 is larger than the bottom width w2. Hence, the deep trench doped region 106 of the exemplary embodiment has a trapezoid structure. The method of forming the deep trench doped region 106 having the trapezoid structure includes changing etching recipes for forming the deep trench 104 (shown in FIG. 1B) so as to form a trapezoid opening in the drift region 102. That means, the formed deep trench 104 has a top width w1 and a bottom width w2, and the top width w1 is larger than the bottom width w2.

In the exemplary embodiment, the deep trench doped region 106 having the trapezoid structure can cause an avalanche breakdown to occur at the PN junction located at the bottom of deep trench doped region 106. In addition, when the transistor device is turned on, the deep trench doped region 106 having the trapezoid structure may also disperse electric current and increase turn-on current so as to reduce the turn-on resistance of the transistor device.

Third Exemplary Embodiment

Figure 3A:
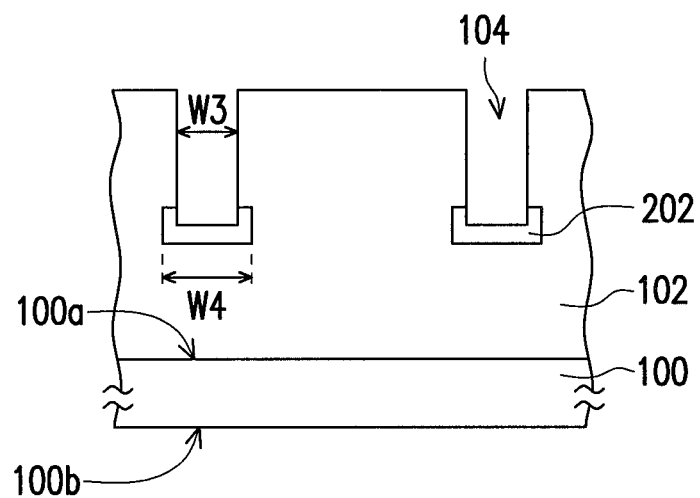
FIG. 3A to FIG. 3E are schematic cross-sectional views showing a method of manufacturing a trench metal oxide semiconductor transistor device according to an exemplary embodiment.

FIG. 3A to FIG. 3E are schematic cross-sectional views showing a method of manufacturing a trench metal oxide semiconductor transistor device according to an exemplary embodiment. The steps shown in FIG. 3A to FIG. 3E are similar to the steps of FIG. 1A to FIG. 1G, so that the same devices are denoted by the same symbols, and descriptions thereof are not repeated. Referring to FIG. 3A, after the deep trench104 is formed in the drift region 102 according to the steps of FIG. 1A and FIG. 1B, an ion implantation process is performed to form a heavily doped region 202 of the second conductivity type at the bottom of the deep trench 104. In the exemplary embodiment, the heavily doped region 202 is a P+ doped region. The ions implanted in the heavily doped region 202 includes aluminium (Al) ions or boron (B) ions, a doping concentration of the heavily doped region 202 is 1E19~1E20 atoms/cm$^3$, and a depth of the heavily doped region 202 is about 0~0.5 μm. Herein, a width W4 of the heavily doped region 202 is larger than a width W3 of the deep trench 104.

Figure 3B:
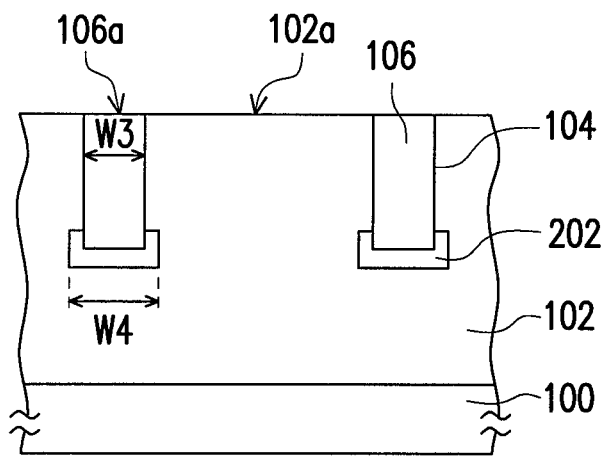

Referring to FIG. 3B, a doped material of a second conductivity type is formed in the deep trench 104 to form a deep trench doped region 106 of the second conductivity type. The method of forming the doped material in the deep trench 104 to form the deep trench doped region 106 is the same or similar to that described and shown in FIG. 1C. After forming the doped material in the deep trench 104 to form the deep trench doped region 106, the heavily doped region 202 is formed at the bottom of the deep trench doped region 106, and the width W4 of the heavily doped region 202 is larger than the width W3 of the deep trench doped region 106.

Figure 3C:
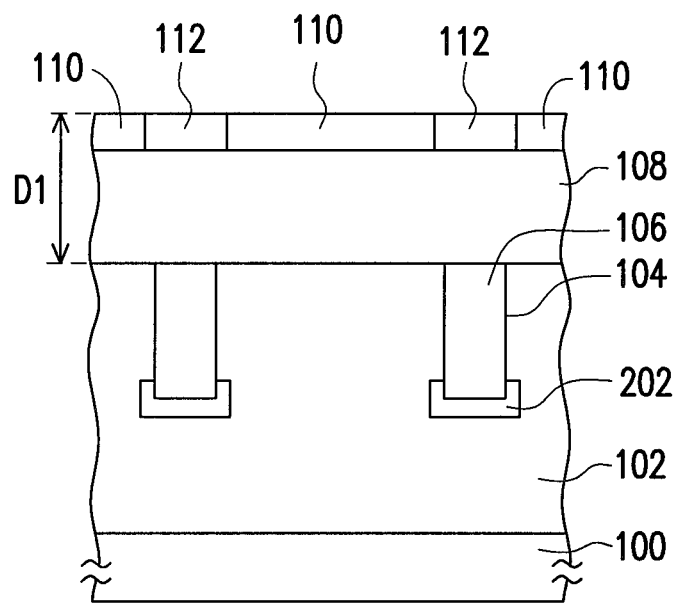
Figure 3D:
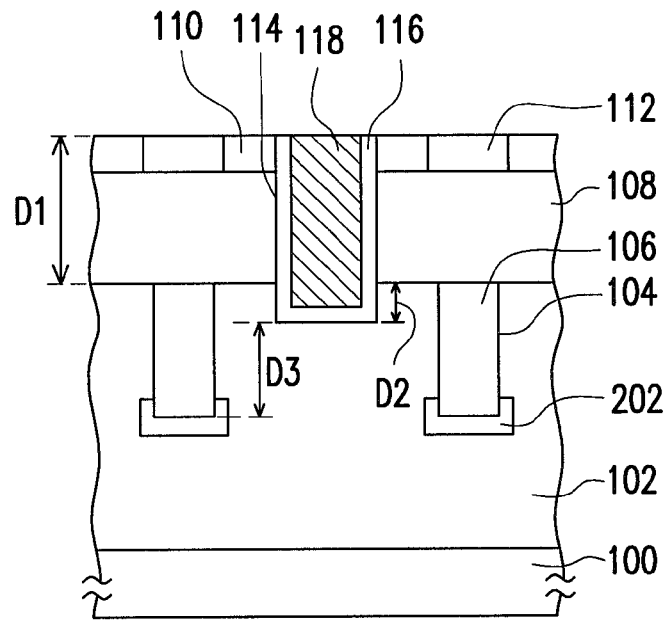
Figure 3E:
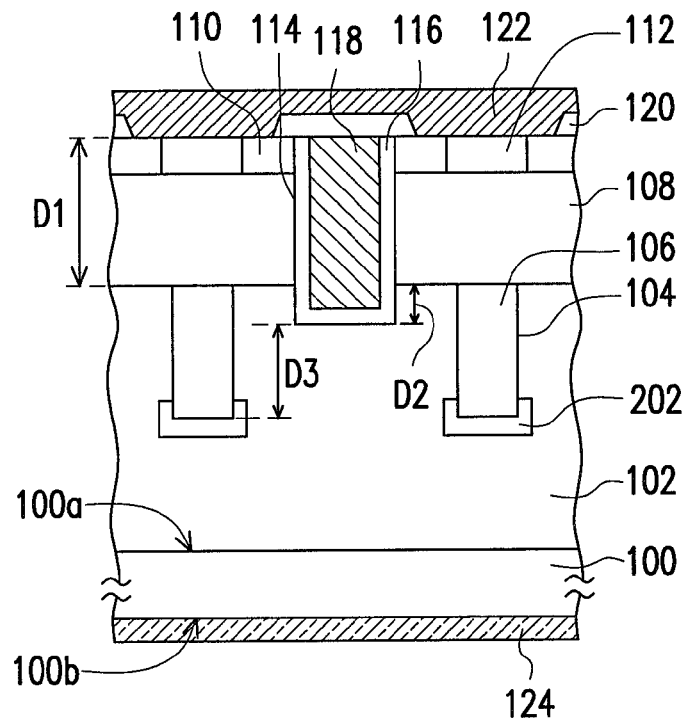

Referring to FIG. 3C, an epitaxial region 108 of the second conductivity type is formed on the drift region 102 and the deep trench doped region 106, and source regions 110, 112 are formed in the epitaxial region 108. The methods of forming epitaxial region 108 and the source regions 110, 112 are the same or similar to those described and shown in FIG. 1D and FIG. 1E. Referring to FIG. 3D, a trench gate 118 is formed in the epitaxial region 108 and a gate insulating layer 116 is formed on a surface of the trench gate 118. Referring to FIG. 3E, a source electrode 122 is formed on the source region 110, 112 and a drain electrode 124 is formed on the second surface 100b of the substrate 100.

It is noted that in the exemplary embodiment, not only the distance between the bottom of the trench gate 118 and the bottom of the deep trench doped region 106 is 0.5~3 μm, but also the heavily doped region 202 is formed at the bottom of the deep trench doped region 106. Therefore, the breakdown voltage of the transistor device can be further reduced, and the breakdown is likely to occur in the heavily doped region 202 (P+ doped region), and thereby the electric field at the trench gate 118 is lower and the protection effect is better.

According to another exemplary embodiment, the feature of the heavily doped region 202 formed at the bottom of the deep trench doped region 106 may also be combined with the deep trench doped region 106 having the trapezoid structure, such that the trench metal oxide semiconductor transistor device has the heavily doped region 202 formed at the bottom of the deep trench doped region 106 in which the deep trench doped region 106 has the trapezoid structure.

Fourth Exemplary Embodiment

Figure 4A:
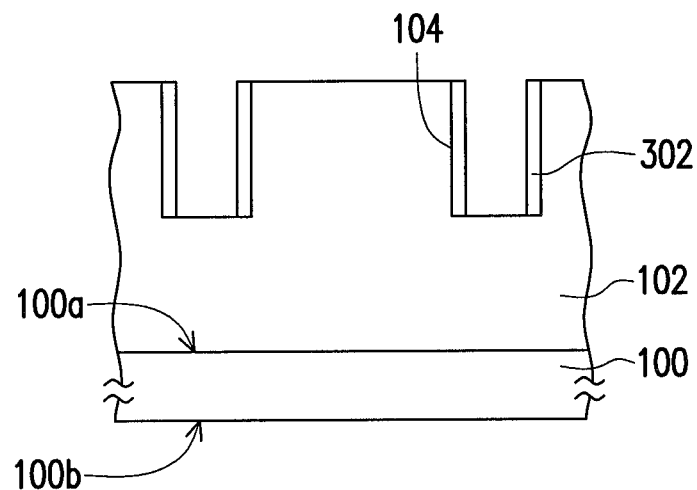
FIG. 4A to FIG. 4F are schematic cross-sectional views showing a method of manufacturing a trench metal oxide semiconductor transistor device according to an exemplary embodiment.

FIG. 4A to FIG. 4F are schematic cross-sectional views showing a method of manufacturing a trench metal oxide semiconductor transistor device according to an exemplary embodiment. The steps shown in FIG. 4A to FIG. 4F are similar to the steps of FIG. 1A to FIG. 1G, so that the same devices are denoted by the same symbols, and descriptions thereof are not repeated. Referring to FIG. 4A, after the deep trench 104 is formed in the drift region 102 according to the steps of FIG. 1A and FIG. 1B, a side spacer 302 is formed on two sides of the deep trench 104. The side spacer 302 comprises silicon oxide, silicon nitride or any other appropriate insulating material. The side spacer 302 is formed by performing a deposition process and then performing an etching back process, for example.

Figure 4B:
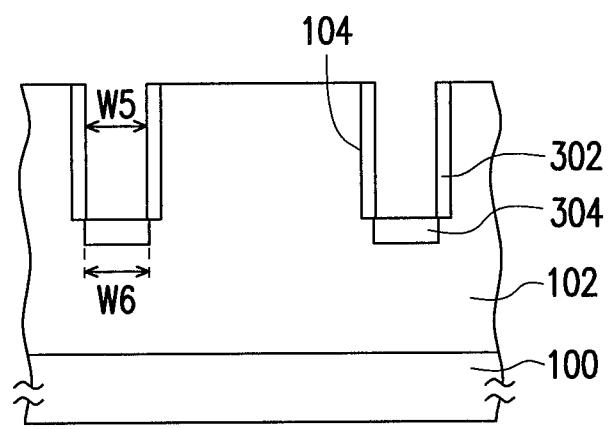

Referring to FIG. 4B, an ion implantation process is performed by using the side spacer 302 as a mask so as to form a heavily doped region 304 of the second conductivity type at a bottom of the deep trench 104. In the exemplary embodiment, the heavily doped region 304 is a P+ doped region. The ions implanted in the heavily doped region 304 includes aluminium (Al) ions or boron (B) ions, a doping concentration of the heavily doped region 304 is 1E19~1E20 atoms/$cm^3$, and a depth of the heavily doped region 304 is about 0~0.5 μm. It is noted that because the ion implantation process is performed by using the side spacer 302 as a mask, the heavily doped region 304 is limited to have a smaller area. Namely, the heavily doped region 304 formed with the method of the exemplary embodiment has a width W6 substantially equal to a width W5 of the deep trench 104.

Figure 4C:
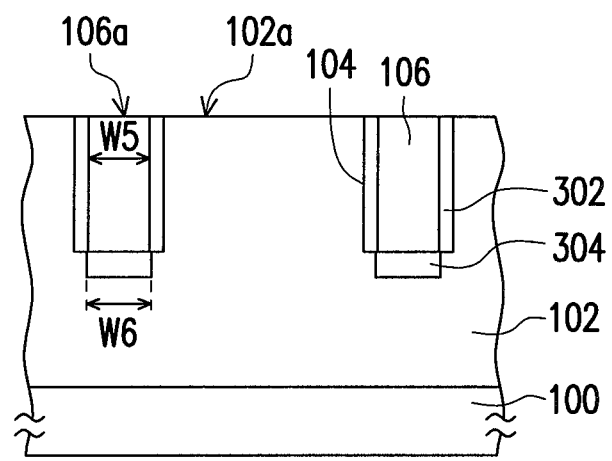

Referring to FIG. 4C, a doped material of a second conductivity type is formed in the deep trench 104 to form a deep trench doped region 106 of the second conductivity type. The method of forming the doped material in the deep trench 104 to form the deep trench doped region 106 is the same or similar to that described and shown in FIG. 1C. After forming the doped material in the deep trench 104 to form the deep trench doped region 106, the side spacer 302 is disposed at two sides of the deep trench doped region 106, and the heavily doped region 304 is formed at the bottom of the deep trench doped region 106. In addition, the width W6 of the heavily doped region 304 is substantially equal to the width W5 of the deep trench doped region 106.

Figure 4D:
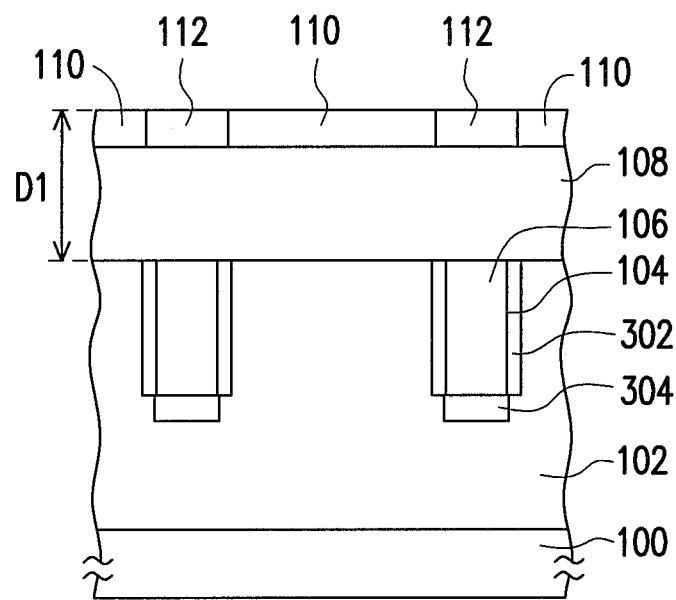
Figure 4E:
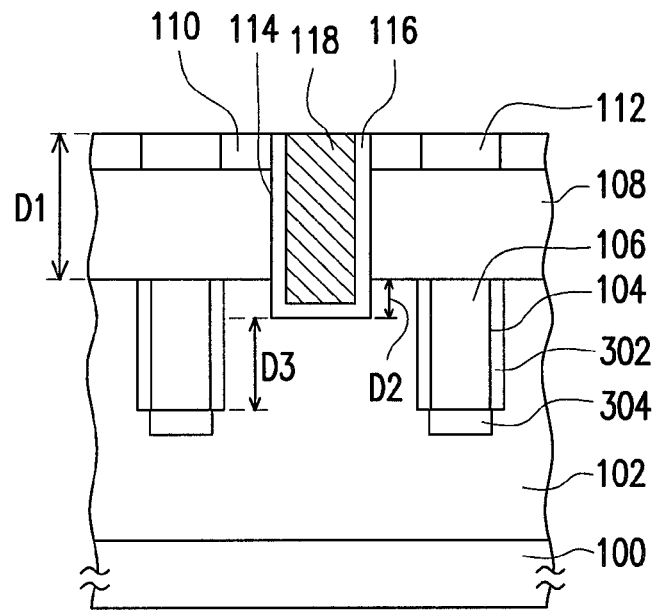
Figure 4F:
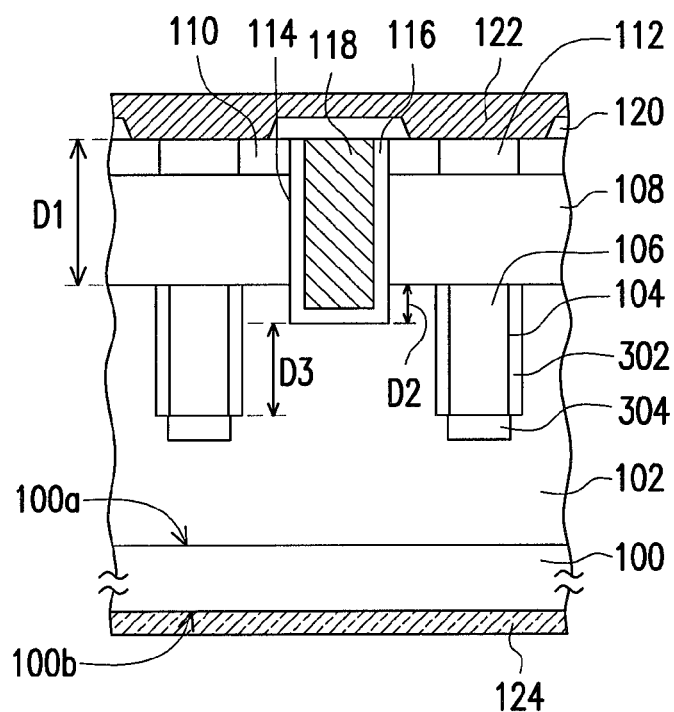

Referring to FIG. 4D, an epitaxial region 108 of the second conductivity type is formed on the drift region 102 and the deep trench doped region 106, and a source region 110, 112 is formed in the epitaxial region 108. Referring to FIG. 4E, a trench gate 118 is formed in the epitaxial region 108 and a gate insulating layer 116 is formed on a surface of the trench gate 118. Referring to FIG. 4F, a source electrode 122 is formed on the source region 110, 112 and a drain electrode 124 is formed on the second surface 100b of the substrate 100.

Accordingly, in the exemplary embodiment, the distance between the bottom of the trench gate 118 and the bottom of the deep trench doped region 106 is 0.5~3 μm, and the heavily doped region 304 is limited to have a smaller area. The heavily doped region 304 having a smaller area may cause the avalanche breakdown to occur at the heavily doped region 304, and the electric current may laterally flow easily so as to reduce the turn-on resistance of the device.

According to another exemplary embodiment, the features of the side spacer 302 formed on two sides of the deep trench doped region 106 and the heavily doped region 202 formed at the bottom of the deep trench doped region 106 may also be combined with the deep trench doped region 106 having the trapezoid structure, such that the trench metal oxide semiconductor transistor device has the side spacer 302 formed on two sides of the deep trench doped region 106 and the heavily doped region 202 formed at the bottom of the deep trench doped region 106 in which the deep trench doped region 106 has the trapezoid structure.

In addition, in the exemplary embodiment of FIG. 4F, the side spacer 302 is formed on two sides of the deep trench doped region 106 and the heavily doped region 304 is formed at the bottom of the deep trench doped region 106. According another exemplary embodiment, the transistor device may also have the side spacer 302 formed on two sides of the deep trench doped region 106, and the heavily doped region 304 formed at the bottom of the deep trench doped region 106 is omitted. Even though the heavily doped region 304 formed at the bottom of the deep trench doped region 106 is omitted, the side spacer 302 can isolate electric current when the transistor device is turned on or operated with a reversed breakdown voltage, such that the transistor device reliability can be improved.

Similarly, the structure of only the side spacer 302 formed on two sides of the deep trench doped region 106 (the heavily doped region 304 formed at the bottom of the deep trench doped region 106 is omitted) may also be combined with the deep trench doped region 106 having the trapezoid structure, such that the trench metal oxide semiconductor transistor device has the side spacer 302 formed on two sides of the deep trench doped region 106, and the deep trench doped region 106 has the trapezoid structure.

In the foregoing exemplary embodiments, since the deep trench 104 of the deep trench doped region 106 is formed with an etching process, the depth of the deep trench 104 can be controlled easily. That is to say, it is not difficult to form the structure that the distance between the bottom of the trench gate 118 and the bottom of the deep trench doped region 106 is 0.5~3 μm. In addition, the thickness of the drift region 102 under the deep trench doped region 106 is thinner than the thickness of the drift region 102 under the trench gate 118, and thus the drift region 102 under the deep trench doped region 106 may form a depleted region quickly. As a result, the PN junction at the bottom of the deep trench doped region 106 may sustain a withstand voltage faster, and an avalanche breakdown easily occurs at this region so as to avoid the breakdown occurring at the bottom and the corner of the trench gate 118.

EXAMPLES

In a conventional metal oxide semiconductor transistor device, a deep trench 104 is not formed to protect the transistor device. In the conventional transistor device, the breakdown voltage is about 2221V, and the breakdown occurs at the bottom and the corner of the trench gate. In addition, the electric field at the bottom and the corner of the gate is about 1.1E7 V/cm which is much higher than a breakdown voltage of a gate insulating layer. That means, the reliability of the conventional metal oxide semiconductor transistor device is not stable.

A trench metal oxide semiconductor transistor device of Example 1 has a structure of FIG. 1G, in which the P type deep trench doped region 106 has a depth about 2 μm. In the transistor device of Example 1, the breakdown is likely to occur at the PN junction at the bottom of the P type deep trench doped region 106, and the electric field distribution is draw away from the trench gate 118, such that the breakdown voltage is about 2040V. In addition, the electric field at the bottom and the corner of the gate is about 2.7E6 V/cm which is lower than a breakdown voltage of a gate insulating layer.

A trench metal oxide semiconductor transistor device of Example 2 has a structure of FIG. 3E, in which the P type deep trench doped region 106 has a depth about 2 μm. In the device of Example 2, the P+ doped region 202 is formed at the bottom of the P type deep trench doped region 106, and the concentration of the P+ doped region 202 is higher than that of the P type deep trench doped region 106. A depleted region formed at the PN junction is narrower than that of Example 1, such that the breakdown of the device of Example 2 occurs faster than that of the device of Example 1. The breakdown voltage of the device of Example 2 is about 1931V. In addition, the electric field at the bottom of the gate is about 1.5E6 V/cm which is satisfying an operation reliability of a gate insulating layer.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A trench metal oxide semiconductor (MOS) transistor device, comprising:
   a substrate of a first conductivity type, having a first surface and a second surface;
   a drift region of the first conductivity type, disposed on the first surface of the substrate and having at least one trench therein;
   a trench doped region of a second conductivity type, disposed in the trench;
   an epitaxial region of the second conductivity type, disposed on the drift region and the trench doped region;
   a trench gate, passing through the epitaxial region, wherein a distance between a bottom of the trench gate and a bottom of the trench doped region is 0.5~3 µm;
   a gate insulating layer, disposed on a surface of the trench gate;
   a source region, disposed in the epitaxial region and disposed beside two sides of the trench gate;
   a drain electrode, disposed on the second surface of the substrate;
   a source electrode, disposed on the source region;
   a side spacer, disposed on two sides of the trench doped region; and
   a doped region of the second conductivity type, disposed at a bottom of the trench doped region, wherein the doped region is in contact with the drift region and the trench doped region.

2. The trench MOS transistor device as claimed in claim 1, further comprising a doped region of the second conductivity type, disposed at a bottom of the trench doped region.

3. The trench MOS transistor device as claimed in claim 2, wherein a width of the doped region is larger than a width of the trench doped region.

4. The trench MOS transistor device as claimed in claim 1, wherein a width of the doped region is substantially equal to a width of the trench doped region.

5. The trench MOS transistor device as claimed in claim 1, wherein the trench doped region has a top width and a bottom width, and the top width is larger than the bottom width.

6. The trench MOS transistor device as claimed in claim 1, wherein the trench gate passes through the epitaxial region and extends to the drift region.

7. The trench MOS transistor device as claimed in claim 1, wherein:
   the substrate is an N type substrate;
   the drift region is an N type drift region, wherein a dopant concentration of the N type substrate is higher that that of the N type drift region;
   the trench doped region is a P trench doped region; and
   the epitaxial region is a P epitaxial region.

8. The trench MOS transistor device as claimed in claim 1, wherein a depth of the doped region is smaller that a depth of the trench doped region.

9. The trench MOS transistor device as claimed in claim 1, wherein a concentration of the doped region is larger that a concentration of the trench doped region.

10. The trench MOS transistor device as claimed in claim 1, wherein the side spacer does not extend to sides of the doped region such that the sides of the doped region is in contact with the drift region.

11. A method of manufacturing a trench metal oxide semiconductor (MOS) transistor device, comprising:
   providing a substrate of a first conductivity type, the substrate having a first surface and a second surface, and a drift region of the first conductivity type being formed on the first surface of the substrate;
   forming at least one trench in the drift region;
   forming a doped material of a second conductivity type in the trench to form a trench doped region of the second conductivity type;
   forming an epitaxial region of the second conductivity type on the drift region and the trench doped region;
   forming a trench gate in the epitaxial region such that the trench gate passes through the epitaxial region;
   forming a gate insulating layer on a surface of the trench gate, wherein a distance between a bottom of the trench gate and a bottom of the trench doped region is 0.5~3 µm;
   forming a source region in the epitaxial region, wherein the source region is disposed beside two sides of the trench gate;
   forming a source electrode on the source region;
   forming a drain electrode on the second surface of the substrate;
   forming a side spacer on two sides of the trench after forming the trench in the drift region; and
   performing an ion implantation process after forming the side spacer, so as to form a doped region of the second conductivity type at a bottom of the trench such that the doped region is in contact with the drift region and the trench doped region.

12. The method as claimed in claim 11, wherein a width of the doped region is larger than a width of the trench.

13. The method as claimed in claim 11, wherein a width of the doped region is substantially equal to a width of the trench.

14. The method as claimed in claim 11, wherein the steps of forming the doped material in the trench to form the trench doped region comprise:
   performing an epitaxial growth process to form the doped material; and
   performing a planarization process to remove a portion of the doped material until a surface of the drift region is exposed.

15. The method as claimed in claim 11, wherein the step of forming the doped material in the trench to form the trench doped region comprises performing a selective epitaxial growth process so as to form the doped material in the trench.

16. The method as claimed in claim 11, wherein the trench formed in the drift region has a top width and a bottom width, and the top width is larger than the bottom width.

17. The method as claimed in claim 11, wherein the trench gate extends to the drift region.

* * * * *